United States Patent
Ueki (10) Patent No.: US 11,621,493 B2
(45) Date of Patent: Apr. 4, 2023

(54) RFIC MODULE, RFID TAG, METHOD FOR MANUFACTURING RFIC MODULE, AND METHOD FOR MANUFACTURING RFID TAG

(71) Applicant: Murata Manufacturing Co., Ltd., Nagaokakyo (JP)

(72) Inventor: Noriyuki Ueki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 50 days.

(21) Appl. No.: 17/116,535

(22) Filed: Dec. 9, 2020

(65) Prior Publication Data

US 2021/0159601 A1    May 27, 2021

Related U.S. Application Data

(63) Continuation of application No. PCT/JP2020/025319, filed on Jun. 26, 2020.

(30) Foreign Application Priority Data

Nov. 25, 2019    (JP) .............................. JP2019-211959

(51) Int. Cl.
*H01Q 9/42* (2006.01)
*G06K 19/077* (2006.01)
*H01L 21/56* (2006.01)
*H01L 23/31* (2006.01)
*H01L 23/544* (2006.01)
(Continued)

(52) U.S. Cl.
CPC ......... *H01Q 9/42* (2013.01); *G06K 19/07773* (2013.01); *H01L 21/561* (2013.01);
(Continued)

(58) Field of Classification Search
CPC .. H01Q 9/42; H01Q 1/38; H01Q 9/40; G06K 19/07773; G06K 19/0775; G06K 19/02;
(Continued)

(56) References Cited

U.S. PATENT DOCUMENTS 6,100,804 A * 8/2000 Brady .................. A01K 11/006
                                                                342/51
6,905,768 B2 * 6/2005 Tada .................... C08G 59/621
                                                                523/452
(Continued)

FOREIGN PATENT DOCUMENTS

| JP | 2007042087 A | 2/2007 |
| JP | 2012103830 A | 5/2012 |
| WO | 2016084658 A1 | 6/2016 |

OTHER PUBLICATIONS

International Search Report issued for PCT/JP2020/025319, dated Aug. 25, 2020 (Japanese version).

*Primary Examiner* — Thien M Le
*Assistant Examiner* — Asifa Habib
(74) *Attorney, Agent, or Firm* — ArentFox Schiff LLP (57) ABSTRACT

An RFIC module is provided that includes a base material; an RFIC mounted on the base material; antenna-side terminal electrodes formed on the base material and constructed to be connected to or coupled to an antenna; and an insulating protective film that covers a first surface of the base material and the RFIC, with the protective film being made of a hot melt resin.

17 Claims, 10 Drawing Sheets

(51) Int. Cl.
*H01L 23/66* (2006.01)
*H01Q 1/38* (2006.01)
*H01Q 9/40* (2006.01)

(52) U.S. Cl.
CPC ........ H01L 23/3135 (2013.01); H01L 23/544 (2013.01); H01L 23/66 (2013.01); H01Q 1/38 (2013.01); H01Q 9/40 (2013.01); *H01L 2223/54406* (2013.01); *H01L 2223/6677* (2013.01)

(58) Field of Classification Search
CPC . H01L 21/561; H01L 23/3135; H01L 23/544; H01L 23/66; H01L 2223/54406; H01L 2223/6677; H01L 23/3121; H01L 2223/54486; H01L 21/56
See application file for complete search history.

(56) References Cited

U.S. PATENT DOCUMENTS

| | | | |
|---|---|---|---|
| 9,659,832 B2* | 5/2017 | Giorgini | H01L 23/3121 |
| 9,836,686 B2 | 12/2017 | Kato et al. | |
| 2005/0227393 A1* | 10/2005 | Sato | H01L 33/501 438/27 |
| 2008/0012709 A1* | 1/2008 | Stobbe | G08B 13/2445 340/572.1 |
| 2008/0187762 A1* | 8/2008 | Hayashi | H01L 33/60 264/328.18 |
| 2008/0203454 A1* | 8/2008 | Asami | H01L 27/105 257/E27.113 |
| 2009/0326100 A1* | 12/2009 | Hamada | H01L 23/295 523/435 |
| 2010/0148380 A1* | 6/2010 | Hayashi | C08G 59/42 257/793 |
| 2010/0253523 A1* | 10/2010 | Bouchard | G06K 19/07718 340/572.8 |
| 2014/0060722 A1* | 3/2014 | Finn | B42D 15/00 156/60 |
| 2016/0189021 A1* | 6/2016 | Forster | G06K 19/07722 235/488 |
| 2016/0353619 A1 | 12/2016 | Kato et al. | |
| 2021/0319278 A1* | 10/2021 | Kato | G06K 19/0772 |
| 2022/0064447 A1* | 3/2022 | Yamazaki | C08K 9/06 |
| 2022/0157748 A1* | 5/2022 | Ono | H05K 3/284 |

* cited by examiner

RFIC MODULE, RFID TAG, METHOD FOR MANUFACTURING RFIC MODULE, AND METHOD FOR MANUFACTURING RFID TAG

CROSS REFERENCE TO RELATED APPLICATIONS

The present application is a continuation of PCT/JP2020/025319 filed Jun. 26, 2020, which claims priority to Japanese Patent Application No. 2019-211959, filed Nov. 25, 2019, the entire contents of each of which are incorporated herein by reference.

TECHNICAL FIELD

The present invention relates to an RFIC (radio frequency integrated circuit) module, an RFID (radio frequency identifier) tag including the RFIC module, a method for manufacturing the RFIC module, and a method for manufacturing the RFID tag.

BACKGROUND

RFID systems include an RFID tag attached to an article, and a reader/writer for reading/writing the RFID tag. Such RFID systems can be used as information management systems for the articles.

WO 2016/084658 A (hereinafter "Patent Literature 1") discloses an RFID tag that includes a conductor acting as an antenna, and an RFIC module coupled to the conductor. An RFID tag of this type includes an RFIC chip for storing predetermined information and processing a predetermined radio signal, and an antenna element (radiator) for transmitting and/or receiving a high-frequency signal. The RFID tag can be attached to various articles (or wrapping and packaging materials of the various articles) for management of the various articles.

The RFID tag disclosed in Patent Literature 1 includes an insulator film on which an antenna is formed, and an RFIC module mounted on the insulator film. The RFIC module includes an RFIC and a base material in which the RFIC is provided.

An RFIC module of conventional type is thin and prone to be deformed. Thus, it is not possible, in manufacturing of an electronic circuit substrate, to handle (e.g., pick and place) the RFIC module by a method such that chip components are absorbed by a vacuum chuck and conveyed. Due to this manufacturing limitation, the RFIC module undesirably reduces manufacturing efficiency and increases manufacturing cost.

Further, at a stage of the RFIC module, an upper part of the RFIC is covered with resin, thereby resulting in a wide and high protruding part from the insulator film on which the antenna is formed. Thus, when characters or the like are printed on a label sheet attached to the RFID tag, the protruding part is likely to cause blurring or bleeding of the characters.

SUMMARY OF THE INVENTION

Accordingly, it is an object of the present invention to provide an RFIC module constructed to be handled by a system similar to a pick-and-place system for chip components in manufacturing of an electronic circuit substrate; and a method for manufacturing the RFIC module. Another object of the present invention is to provide an RFID tag in which an RFIC mounting part protrudes less sharply from an insulator film on which an antenna is formed; and a method for manufacturing the RFID tag.

Thus, an exemplary aspect of the present disclosure provides an RFIC module that includes a base material; an RFIC mounted on the base material; an antenna-side terminal electrode formed on the base material and configured to be connected to or coupled to an antenna; and a protective film that is insulating and covers a first surface of the base material and the RFIC. Moreover, in the exemplary aspect of the RFIC module, the protective film comprises a hot melt resin.

An exemplary aspect of the present disclosure provides an RFID tag that includes a flexible insulator film and on which an antenna pattern is formed; an RFIC module mounted on a first surface of the insulator film; and a label sheet configured to cover the first surface of the insulator film on which the RFIC module is mounted.

Moreover, in an exemplary aspect, the RFIC module includes a base material; an RFIC mounted on the base material; an antenna-side terminal electrode formed on the base material and configured to be connected to or coupled to an antenna; and an insulating protective film that covers a first surface of the base material and the RFIC, with the protective film being made of a hot melt resin.

In an exemplary aspect, the protective film is softened to spread out between the insulator film and the label sheet.

According to another exemplary aspect of the present disclosure, a method for manufacturing an RFIC module is provided that includes mounting a plurality of RFICs on a first surface of a base material for a plurality of RFIC modules, on which a conductor pattern for connecting or coupling to an antenna pattern and a conductor pattern for connecting to an RFIC are respectively formed; forming a protective film of a hot melt resin on the first surface of the base material; heat-pressing and flatten the base material; and separating the base material in a unit of an RFIC module.

An exemplary aspect of the present disclosure further provides a method for manufacturing an RFID tag in which an RFIC module provided on a first surface of the flexible insulator film and on which an antenna pattern is formed.

In this aspect, the RFIC module includes a base material; an RFIC mounted on the base material; an antenna-side terminal electrode formed on the base material and configured to be connected to or coupled to an antenna; and a protective film that is insulating and covers a first surface of the base material and the RFIC, the protective film being made of a hot melt resin.

Moreover, the exemplary method for manufacturing the RFID tag includes mounting the RFIC module on the first surface of the insulator film, and covering the first surface of the insulator film with a label sheet or a release paper sheet to form a laminated body; and pressurizing and heating the laminated body to soften the protective film.

The exemplary aspects of the present invention provide an RFIC module that is constructed to be handled by a system similar to a pick-and-place system for chip components in manufacturing of an electronic circuit substrate. Further the present disclosure provides an RFID tag in which an RFIC mounting part protrudes less sharply from an insulator film on which an antenna is formed, and when characters or the like are printed on a label sheet, blurring or bleeding of the characters is reduced at the protruding part.

DETAILED DESCRIPTION OF EMBODIMENTS

Hereinafter, a plurality of exemplary embodiments will be described with reference to the drawings and several specific examples. In each of the drawings, the same or similar elements and sections are denoted by the same reference signs. While the exemplary embodiments are separately indicated for the sake of convenience in consideration of the ease of description or understanding of main points, the partial replacement or combination of configurations described in different embodiments may be made. In a second exemplary embodiment and subsequent embodiments, the description of matters common to a first embodiment will be omitted, and only points different from the first embodiment will be described. In particular, similar effects due to similar configurations are not mentioned one by one in each embodiment.

First Exemplary Embodiment

Figure 1A:
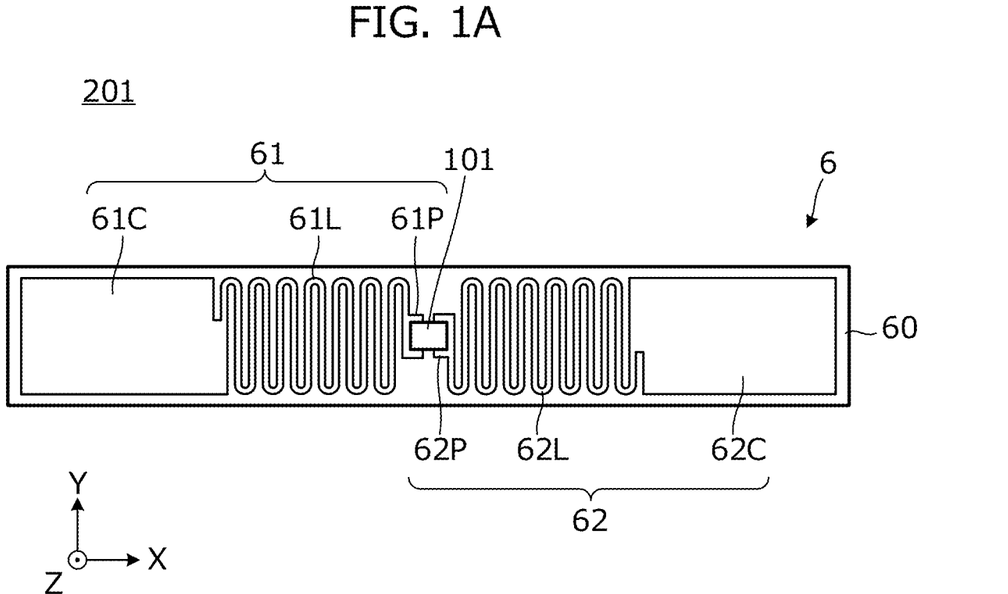
FIG. 1A is a plan view of an RFID tag 201 according to a first exemplary embodiment.
Figure 1B:
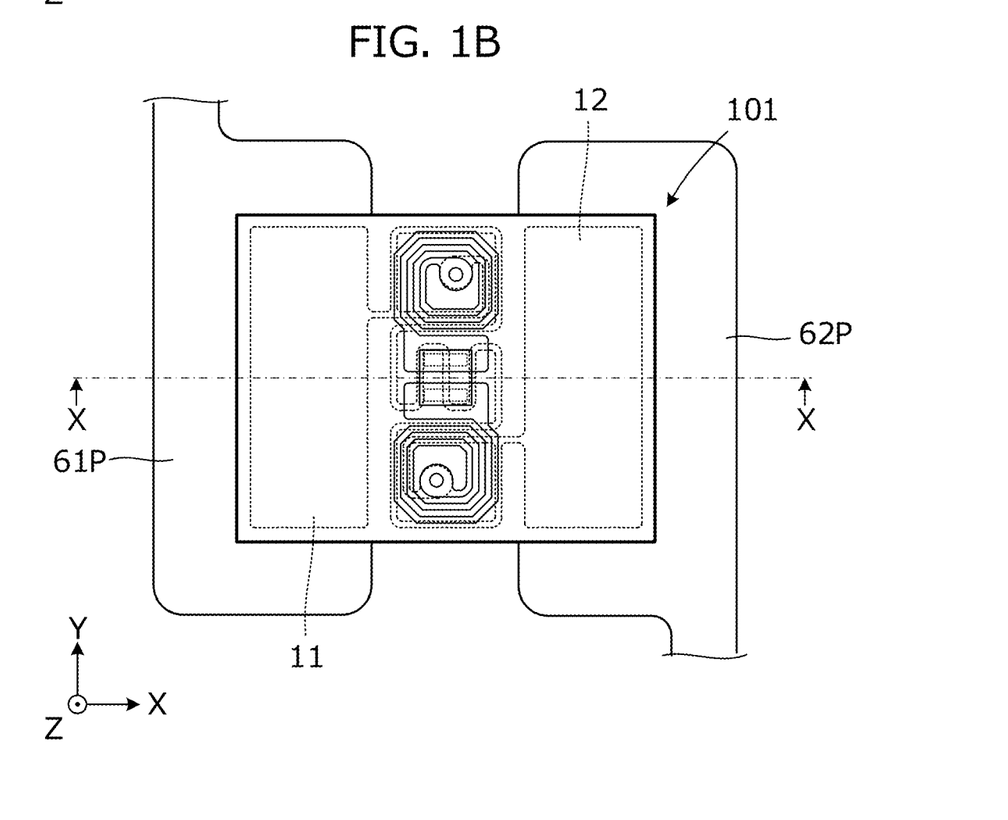
FIG. 1B is an enlarged plan view of a mounting part of an RFIC module 101 included in the RFID tag 201.

FIG. 1A is a plan view of an RFID tag 201 according to a first exemplary embodiment. FIG. 1B is an enlarged plan view of a mounting part of an RFIC module 101 included in the RFID tag 201. In general, the RFIC module 101 and/or the RFID tag 201 can be considered a wireless communication device according to an exemplary aspect.

The RFID tag 201 includes an antenna 6, and the RFIC module 101 coupled to the antenna 6. The antenna 6 includes an insulator film 60, and conductor patterns 61 and 62 formed on the insulator film 60. Each of the conductor patterns 61 and 62 corresponds to an antenna pattern according to the present disclosure. The insulator film 60 is, for example, a polyethylene terephthalate (PET) film, and each of the conductor patterns 61 and 62 is, for example, an aluminum foil pattern in an exemplary aspect.

The conductor pattern 61 includes conductor patterns 61P, 61L, and 61C. The conductor pattern 62 includes conductor patterns 62P, 62L, and 62C. The conductor patterns 61 and 62 form a dipole antenna.

The RFIC module 101 is mounted on the conductor patterns 61P and 62P. Each of the conductor patterns 61L and 62L has a meander line shape and acts as a region having a high inductance component. Each of the conductor patterns 61C and 62C has a planar shape and acts as a region having a high capacitance component. With this configuration, the inductance component of a region with high current intensity is increased and the capacitance component of a region with high voltage intensity is increased, thereby reducing a region where the conductor patterns 61 and 62 of the antenna are formed.

Figure 2:
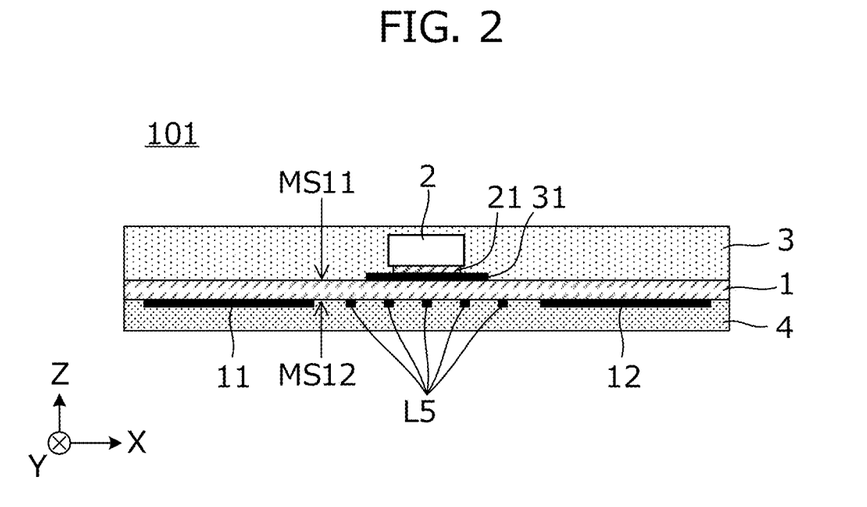
FIG. 2 is a cross-sectional view of the RFIC module 101, taken along line X-X in FIG. 1B.

FIG. 2 is a cross-sectional view of the RFIC module 101, taken along line X-X in FIG. 1B. The RFIC module 101 includes a base material 1 and an RFIC 2. The RFIC 2 is mounted on a first surface MS11 of the base material 1. The base material 1 is, for example, a flexible substrate such as polyimide. The first surface MS11 of the base material 1, on which the RFIC 2 is mounted, is covered with a protective film 3. The protective film 3 is formed of a hot melt resin such as ethylene vinyl acetate (EVA), polyolefin, thermoplastic rubber, or polyamide. The base material 1 also has a second surface MS12 where a coverlay film 4 is formed. The coverlay film 4 is, for example, a polyimide film in an exemplary aspect.

The hot melt resin forming the protective film 3 is a resin material having a softening point of, for example, 60° C. or more, with the softening point being measured in an R & B (Ring and Ball) method (i.e., an R & B softening point). The protective film 3 is hard at normal temperature (e.g., room temperature) and has a flat surface.

Figure 3:
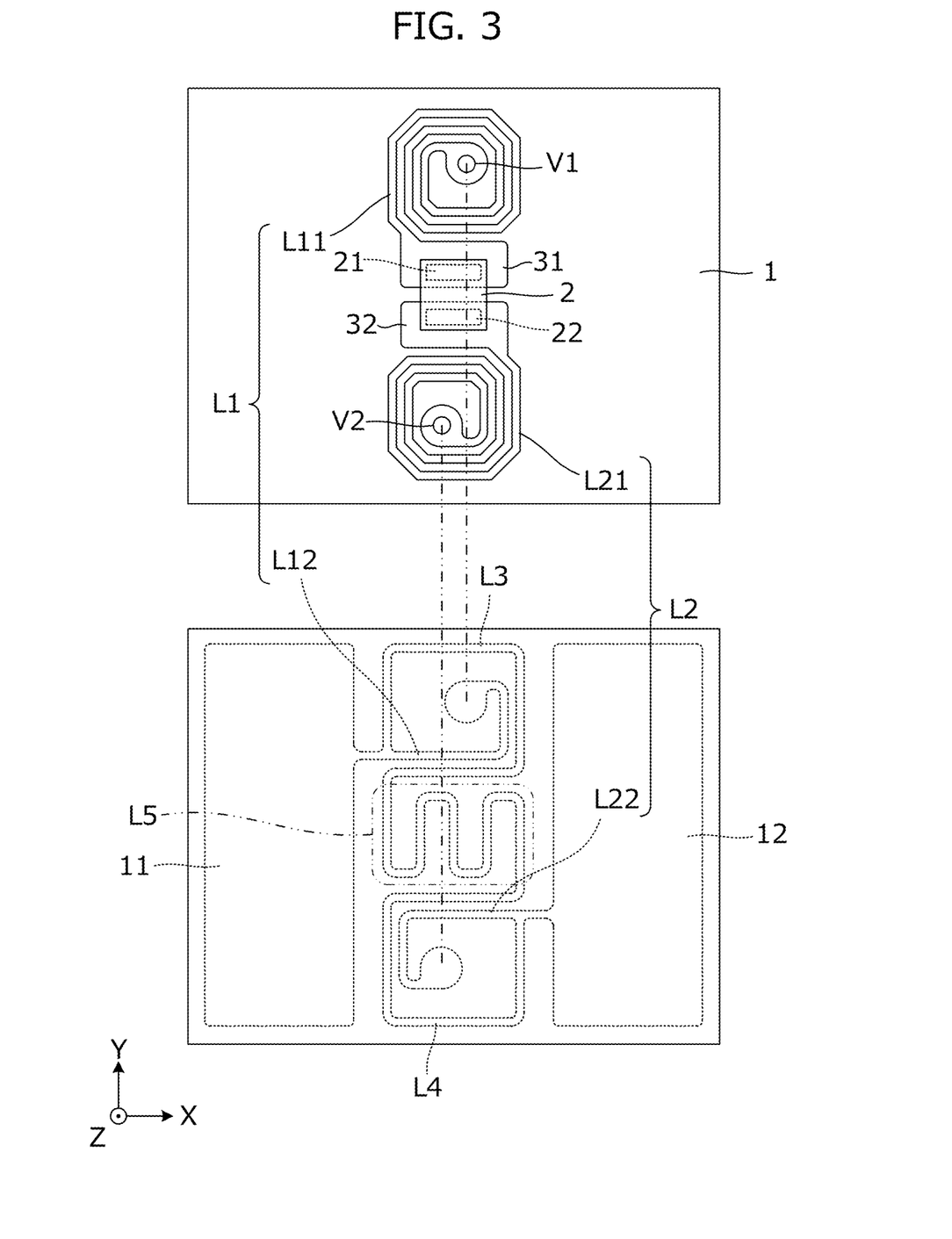
FIG. 3 provides plan views illustrating a conductor pattern formed on a base material 1 of the RFIC module 101.

FIG. 3 is a plan view illustrating a conductor pattern formed on the base material 1 of the RFIC module 101. An upper part of FIG. 3 is a plan view of a conductor pattern formed on an upper surface of the base material 1, and a lower part of FIG. 3 is a plan view of a conductor pattern formed on a lower surface of the base material 1.

On the upper surface of the base material 1, an RFIC-side first terminal electrode 31, an RFIC-side second terminal electrode 32, a conductor pattern L11 of main part of a first inductor L1, and a conductor pattern L21 of main part of a second inductor L2 are formed. The RFIC-side first terminal electrode 31 is connected to one end of the conductor pattern L11, and the RFIC-side second terminal electrode 32 is connected to one end of the conductor pattern L21. These conductor patterns are, for example, copper foil patterned by photolithography.

On the lower surface of the base material 1, an antenna-side first terminal electrode 11 and an antenna-side second terminal electrode 12 are formed. The antenna-side first terminal electrode 11 and the antenna-side second terminal electrode 12 are respectively capacitively coupled to the conductor patterns 61P and 62P of the antenna 6. Further, on the lower surface of the base material 1, a conductor pattern L12 of a part of the first inductor L1, a conductor pattern L22 of a part of the second inductor, a conductor pattern of a third inductor L3, a conductor pattern of a fourth inductor L4, and a conductor pattern of a fifth inductor L5 (i.e., a conductor pattern surrounded with a two-point chain line) are formed. These conductor patterns are also, for example, copper foil patterned by photolithography in an exemplary aspect.

As further shown, one end (e.g., a first end) of the conductor pattern L12 of the part of the first inductor L1 and one end (e.g., a first end) of the conductor pattern of the third inductor L3 are connected to the antenna-side first terminal electrode 11. Similarly, one end (e.g., a first end) of the conductor pattern L22 of the part of the second inductor L2 and one end (e.g., a first end) of the conductor pattern of the fourth inductor L4 are connected to the antenna-side second terminal electrode 12. The conductor pattern of the fifth inductor L5 is connected between the other end (e.g., a second end) of the conductor pattern of the third inductor L3 and the other end (e.g., a second end) of the conductor pattern of the fourth inductor L4.

The other end (e.g., a second end) of the conductor pattern L12 of the first inductor L1 and the other end (e.g., a second end) of the conductor pattern L11 of the main part of the first inductor L1 are connected to each other via a via conductor V1. Similarly, the other end (e.g., a second end) of the conductor pattern L22 of the second inductor L2 and the other end (e.g., a second end) of the conductor pattern L21 of the main part of the second inductor L2 are connected to each other via a via conductor V2.

As further shown, the RFIC 2 is mounted on the RFIC-side first terminal electrode 31 and the RFIC-side second terminal electrode 32. In other words, a terminal 21 of the RFIC 2 is connected to the RFIC-side first terminal electrode 31, and a terminal 22 of the RFIC 2 is connected to the RFIC-side second terminal electrode 32.

The first inductor L1 and the third inductor L3 are respectively formed in different layers of the base material 1, and are disposed to have coil openings overlap each other. Similarly, the second inductor L2 and the fourth inductor L4 are respectively formed in different layers of the base material 1, and are disposed to have coil openings overlap each other. Further, the second inductor L2 and the fourth inductor L4, and the first inductor L1 and the third inductor L3 are disposed to interpose the position where the RFIC 2 is mounted along the surfaces of the base material 1.

Figure 4:
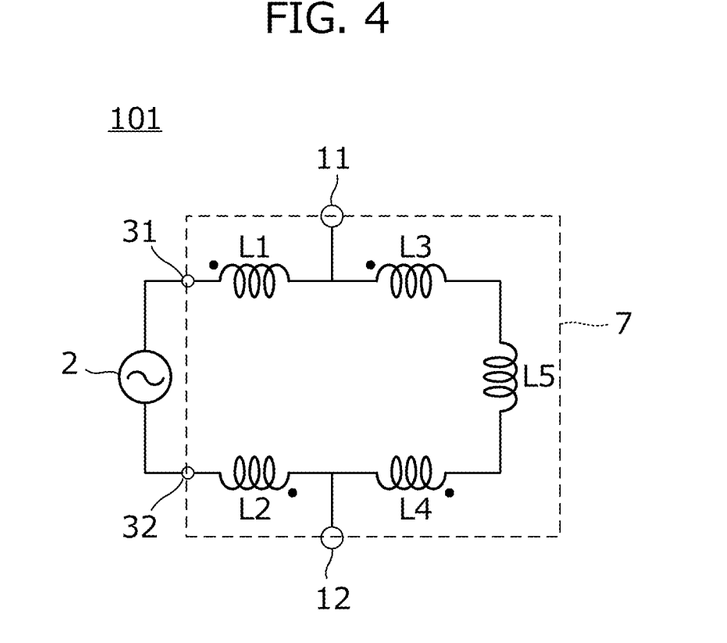
FIG. 4 is a circuit diagram of the RFIC module 101.

FIG. 4 is a circuit diagram of the RFIC module 101. The RFIC module 101 includes the RFIC 2 and an impedance matching circuit 7. The impedance matching circuit 7 is connected to the RFIC-side first terminal electrode 31, the RFIC-side second terminal electrode 32, the antenna-side first terminal electrode 11, and the antenna-side second terminal electrode 12. The impedance matching circuit 7 includes the first inductor L1, the second inductor L2, the third inductor L3, the fourth inductor L4, and the fifth inductor L5 that are connected in series to each other in the exemplary aspect.

The first inductor L1 includes the conductor patterns L11 and L12, each illustrated in FIG. 3. The second inductor L2 includes the conductor patterns L21 and L22, each illustrated in FIG. 3. The first inductor L1 is connected between the antenna-side first terminal electrode 11 and the RFIC-side first terminal electrode 31. The second inductor L2 is connected between the antenna-side second terminal electrode 12 and the RFIC-side second terminal electrode 32. One end of the third inductor L3 is connected to the antenna-side first terminal electrode 11, and one end of the fourth inductor L4 is connected to the antenna-side second terminal electrode 12. The fifth inductor L5 is connected between the other end of the third inductor L3 and the other end of the fourth inductor L4.

Figure 5A:
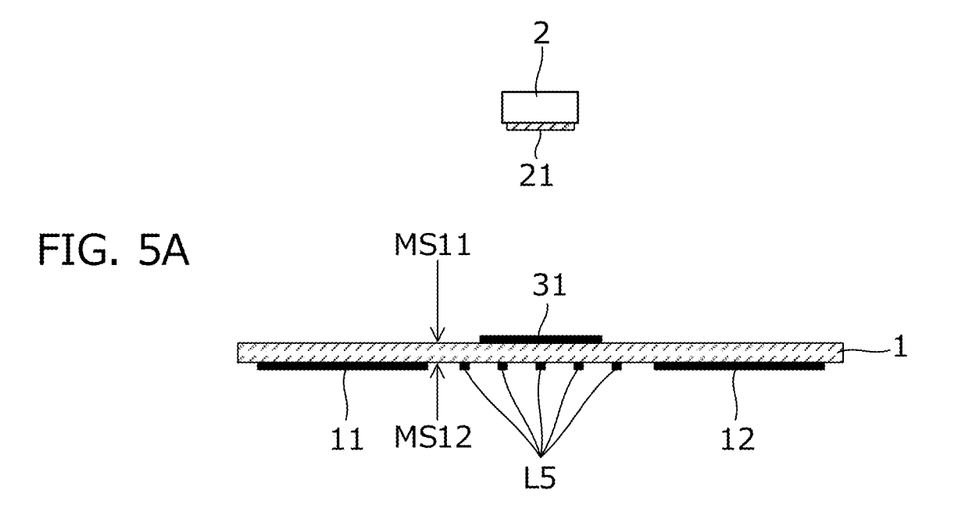
FIGS. 5A, 5B, and 5C are cross-sectional views of the RFIC module 101 at each manufacturing stage.
Figure 5B:
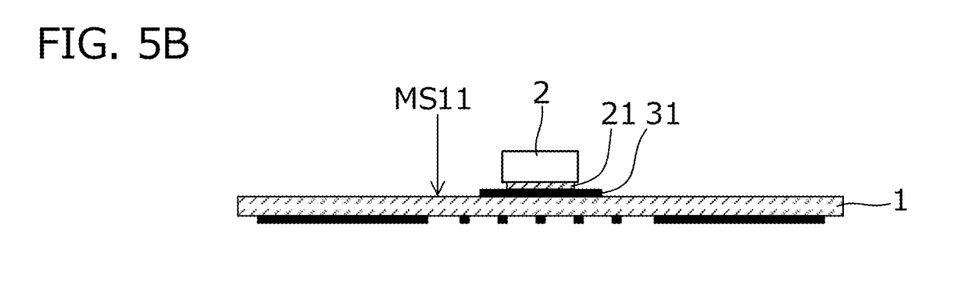
Figure 5C:
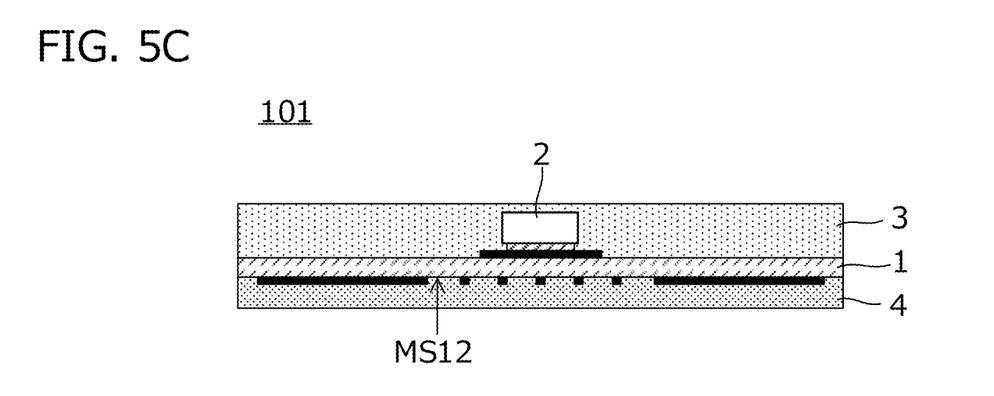

Next, a method for manufacturing the RFIC module 101 will be described. FIGS. 5A, 5B, and 5C are cross-sectional views of the RFIC module 101 at each manufacturing stage. First, as illustrated in FIG. 5A, various conductor patterns are formed on the first surface MS11 and the second surface MS12 of the base material 1. In FIG. 5A, the antenna-side first terminal electrode 11 and the antenna-side second terminal electrode 12 are on the second surface MS12 of the base material 1. The RFIC-side first terminal electrode 31 is on the first surface MS11 of the base material 1. Subsequently, as illustrated in FIG. 5B, the RFIC 2 is surface-mounted by soldering to the RFIC-side first terminal electrode 31 and the RFIC-side second terminal electrode 32.

Subsequently, as illustrated in FIG. 5C, the coverlay film 4 is attached to the second surface MS12 of the base material 1. Concurrently, a hot melt resin sheet is placed on the upper surface of the base material 1, and a heat-press is performed. Consequently, the protective film 3 having an even thickness and a flat surface is formed to cover the RFIC 2 in the exemplary aspect.

It is noted that, the coverlay film 4 may be provided at a previous stage of the process where the protective film 3 is formed or the process where the RFIC 2 is mounted in alternative aspects.

Figure 6:
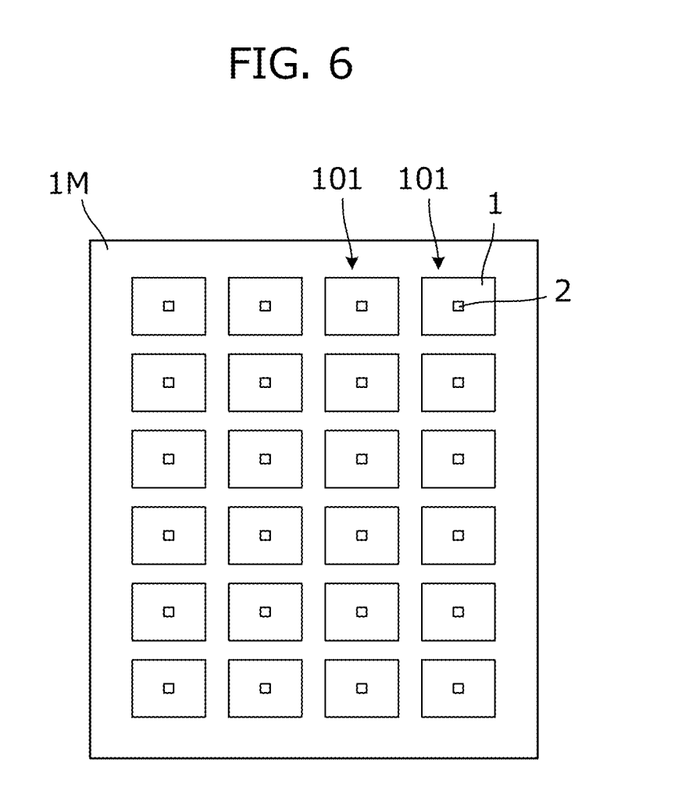
FIG. 6 is a schematic plan view of each of the RFIC module in a state where the RFIC modules are arranged on a mother board.

FIG. 6 is a schematic plan view of the RFIC modules in a mother board state. Each of FIGS. 5A, 5B, and 5C illustrates the cross-sectional view of a single RFIC module for convenience of description; however, in the actual state, as illustrated in FIG. 6, the RFIC modules 101 are formed in a plurality of sections of a base material 1M as the mother board state. In other words, conductor patterns for a plurality of the RFIC modules 101 are formed on the base material 1M; the RFIC 2 is mounted thereon; the coverlay film 4 is attached thereto; and the protective film 3 is formed thereon. Then, the plurality of RFIC modules 101 are separated.

The RFIC module 101 of this embodiment includes the protective film 3 formed of the hot melt resin, and thus has an appropriate thickness and rigidity. In this state, it is possible to transfer the RFIC module 101 by a pick-and-place machine. Further, the RFIC module 101 may be supplied by a parts feeder for chip components, and may be transferred by a mounter for chip components.

For example, the RFIC modules 101 are separated from the base material 1M in a state illustrated in FIG. 6, and then each of them is conveyed by the parts feeder, and is placed on the insulator film as will be illustrated later by the mounter. Alternatively, the RFIC module 101 may be picked up by a vacuum sucker from the base material 1M to be placed on the insulator film.

Figure 7A:
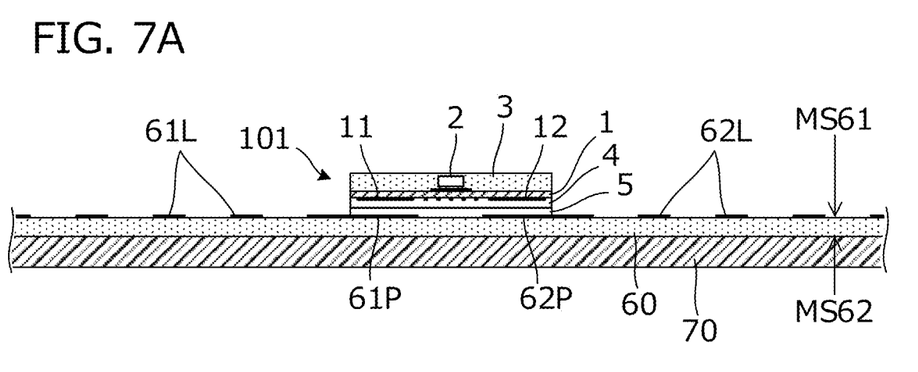
FIGS. 7A, 7B, and 7C are cross-sectional views of the RFID tag 201 at each manufacturing stage.
Figure 7B:
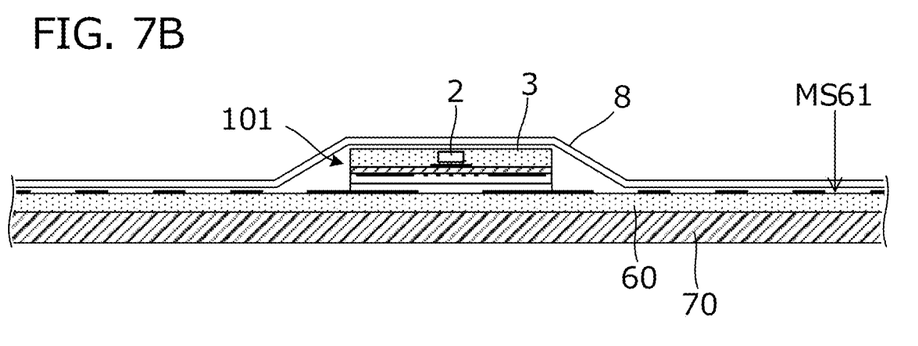
Figure 7C:
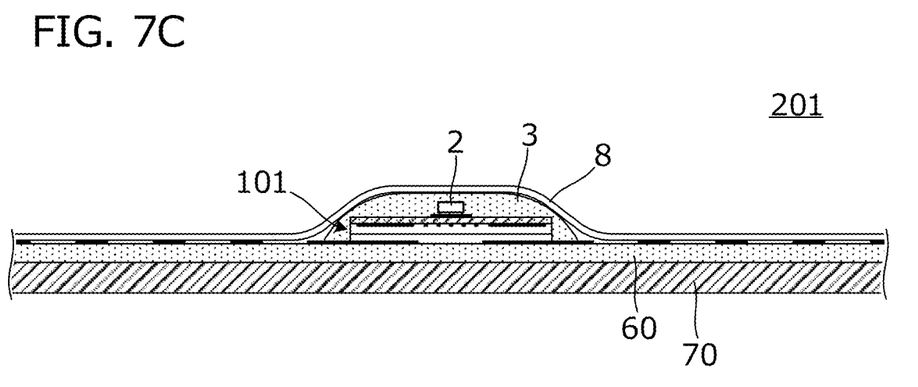

Next, a method for manufacturing the RFID tag 201 will be described in a sequential order of process steps. FIGS. 7A, 7B, and 7C are cross-sectional views of the RFID tag 201 at each manufacturing stage.

First, as illustrated in FIG. 7A, the antenna patterns, such as the conductor pattern 61P, 62P, 61L, and 62L, are formed on a first surface MS61 of the insulator film 60. Next, the insulator film 60 is attached to a support film 70. The insulator film 60 has a second surface MS62 on which an adhesive layer is formed. Each of the insulator film 60 and the support film 70 is a long object for holding a large number of the RFID tags in an array.

Subsequently, the RFIC module 101 is mounted on the first surface MS61 of the insulator film 60 with an adhesive layer 5 bonded between the RFIC module 101 and the first surface MS61 of the insulator film 60. Here, the RFIC module 101 is not heated, but attached at normal temperature (e.g., room temperature). In this state, the antenna-side first terminal electrode 11 and the conductor pattern 61P oppose each other with the coverlay film 4 and the adhesive layer 5 therebetween; and similarly the antenna-side second terminal electrode 12 and the conductor pattern 62P oppose each other with the coverlay film 4 and the adhesive layer 5 therebetween.

Subsequently, as illustrated in FIG. 7B, the first surface MS61 of the insulator film 60 is covered with a label sheet 8 such that the upper part of the RFIC module 101 is covered. The label sheet 8 has, on its inner surface, an adhesive layer. The label sheet 8 covers the insulator film 60 and the upper part of the RFIC module 101, and is attached to them via the adhesive layer. The label sheet 8 is a resin sheet or a paper sheet according to exemplary aspects.

The long object described above is wound into a roll and conveyed (e.g., the long object is run) from a supply side roll to a winding side roll, and during the conveyance, the process steps above are consecutively executed.

Subsequently, in a state where the large number of RFID tags, each illustrated in FIG. 7B, are wound into a roll, the roll is heated to be tightly wounded. Due to the heating, the protective film 3 is melted, and due to pressure caused by the tight winding, corners of the protective film 3 are rounded. Further, in accordance with an amount of the protective film 3 and a height from the insulator film 60 to the protective film 3, the protective film 3 melts to spread out to an upper surface of the insulator film 60 as illustrated in FIG. 7C. Thereby, the label sheet 8 covering the upper part of the RFIC module 101 is gently shaped. Further, an area, in which the insulator film 60, the RFIC module 101 and the label sheet 8 are adhered to each other, is increased, thereby resulting in increased adhesive strength.

As has been described above, the label sheet 8 is attached, and in this state, predetermined characters, marks, patterns, and/or the like are printed on an outer surface of the label sheet 8 in a ribbon thermal transfer method. With the RFID tag 201 of this embodiment, the label sheet 8 has small dents and bumps in a vicinity of the RFIC module 101. Accordingly, the predetermined characters, marks, patterns, and/or the like are clearly printed on the label sheet 8.

It is noted that, after the label sheet 8 has been attached, instead of being heated in the rolled state, the RFID tag in a state illustrated in FIG. 7B may pass between heat press rollers while conveyed from the supplying side roll to the winding side roll. As a result, the protective film 3 may be heated and pressurized.

Further, in the process step illustrated in FIG. 7B, instead of the label sheet 8, a release paper sheet may be attached, and the protective film 3 may be softened to round the corners of the protective film 3 by heating. Subsequently, the release paper sheet may be removed, and the label sheet 8 may be attached to the insulator film 60.

When an RFID tag is provided to an article, the RFID tag 201 may be removed from the support film 70 to be attached to the article. As a result, an RFID tagged article is provided.

Second Exemplary Embodiment

The second exemplary embodiment exemplifies an RFIC module and a RFID tag including the RFIC module. In this embodiment, the RFIC module has no impedance matching circuit between an RFIC and an antenna. Here, the points different in configuration from that of the first embodiment will be described.

Figure 8A:
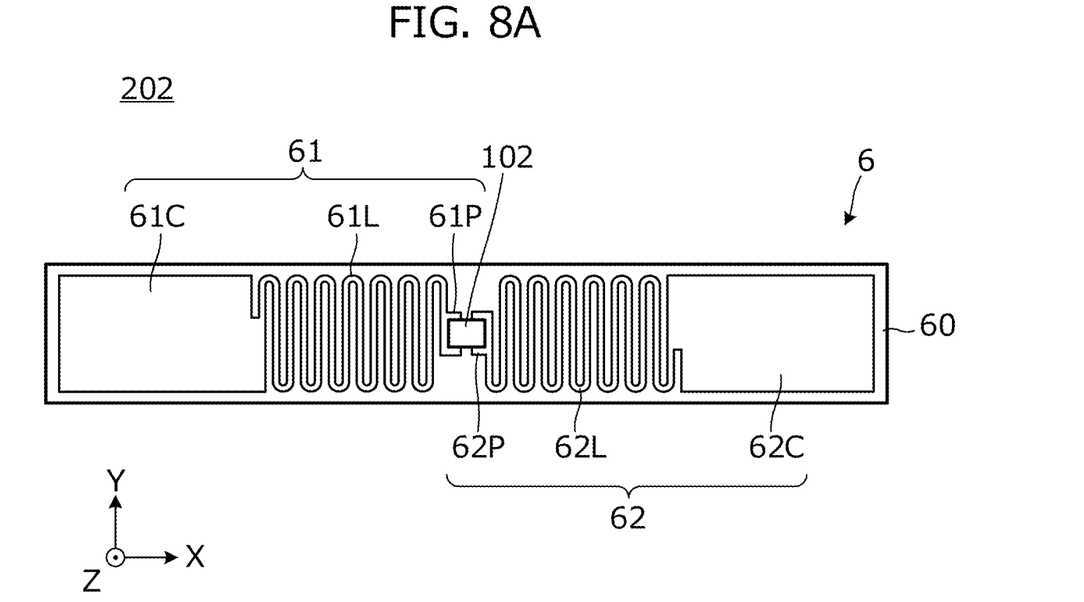
FIG. 8A is a plan view of an RFID tag 202 according to a second exemplary embodiment.
Figure 8B:
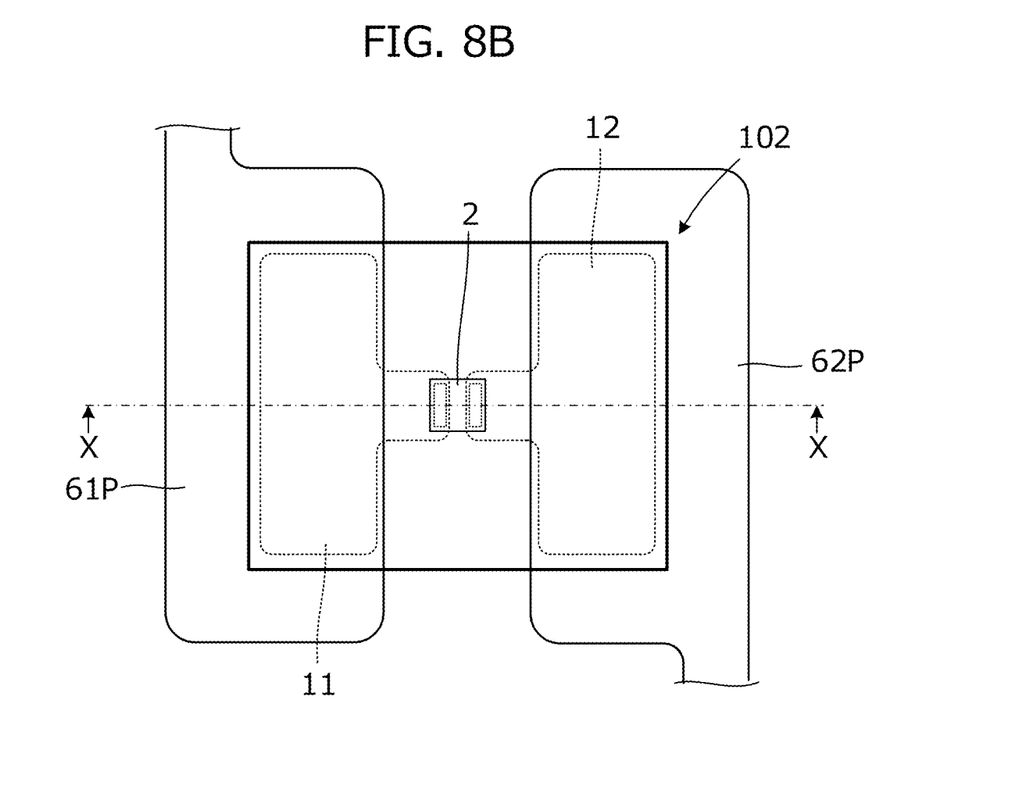
FIG. 8B is an enlarged plan view of a mounting part of an RFIC module 102 included in the RFID tag 202.

FIG. 8A is a plan view of an RFID tag 202 according to the second embodiment. FIG. 8B is an enlarged plan view of a mounting part of an RFIC module 102 included in the RFID tag 202.

The RFID tag 202 includes an antenna 6 and the RFIC module 102. The RFIC module 102 is coupled to the antenna 6. The antenna 6 includes an insulator film 60, and conductor patterns 61 and 62 formed on the insulator film 60. The conductor pattern 61 includes conductor patterns 61P, 61L, and 61C. The conductor pattern 62 includes conductor patterns 62P, 62L, and 62C. The conductor patterns 61 and 62 form a dipole antenna. The configuration of the antenna 6 is the same as that of the first embodiment.

Figure 9:
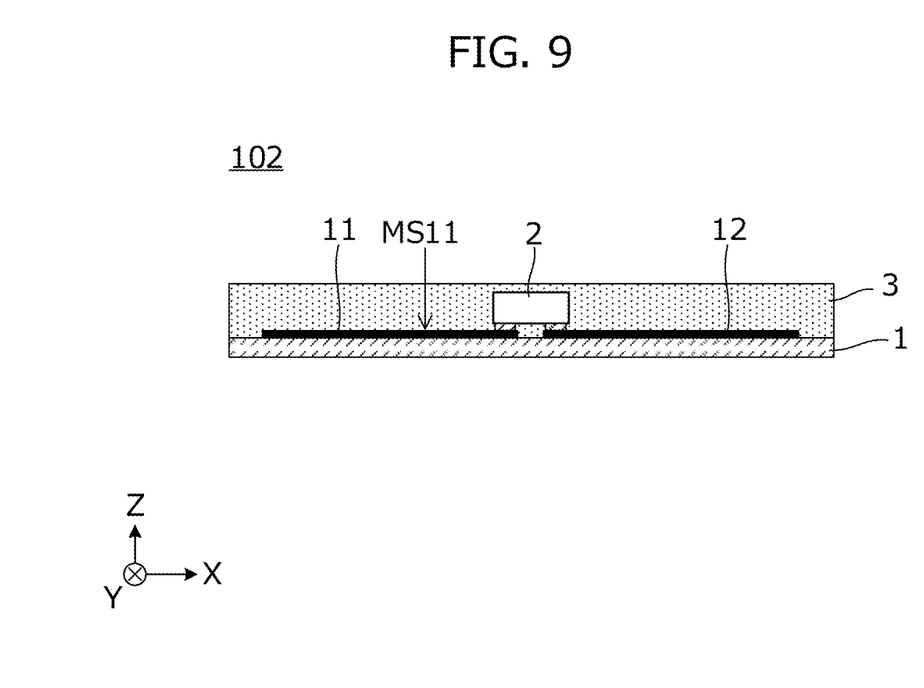
FIG. 9 is a cross-sectional view of the RFIC module 102.

FIG. 9 is a cross-sectional view of the RFIC module 102. The RFIC module 102 includes a base material 1 and an RFIC 2. The RFIC 2 is mounted on a first surface MS11 of the base material 1. The base material 1 is, for example, a flexible substrate such as polyimide. The first surface MS11 of the base material 1, on which the RFIC 2 is mounted, is covered with a protective film 3. The protective film 3 is formed of a hot melt resin.

Figure 10A:
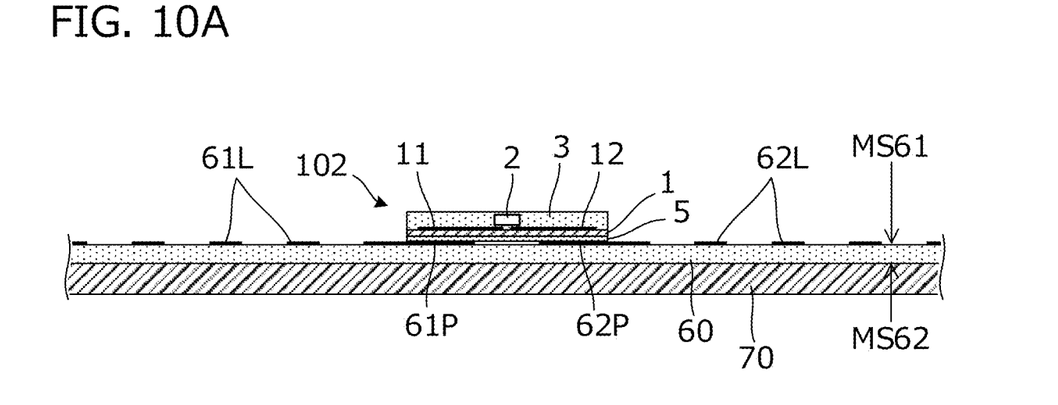
FIGS. 10A, 10B, and 10C are cross-sectional views of the RFID tag 202 at each manufacturing stage.
Figure 10B:
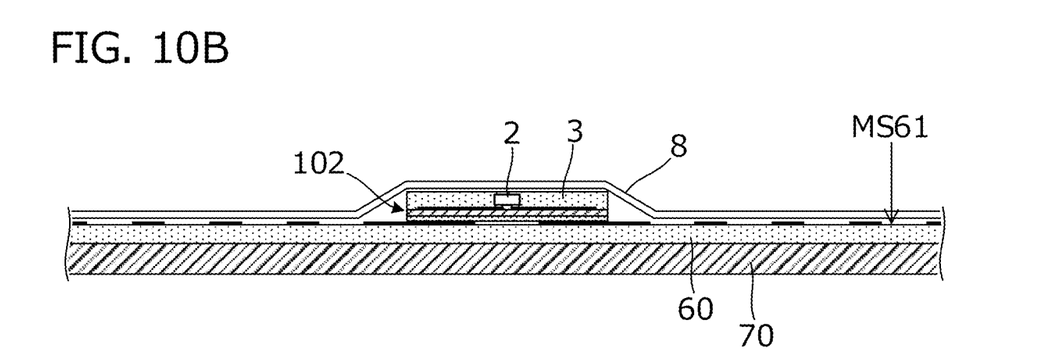
Figure 10C:
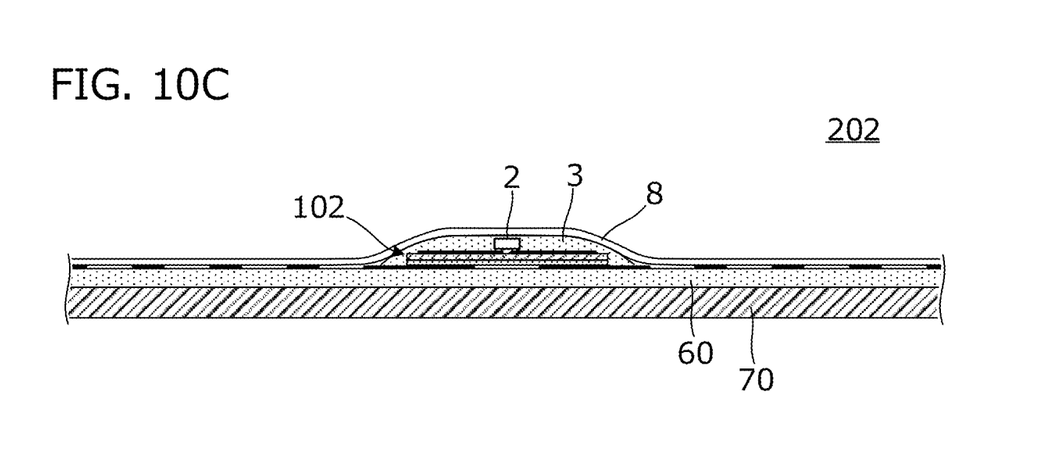

Next, a method for manufacturing the RFID tag 202 will be described. FIGS. 10A, 10B, and 10C are cross-sectional views of the RFID tag 202 at each manufacturing stage.

First, as illustrated in FIG. 10A, antenna patterns, such as conductor patterns 61P, 62P, 61L, and 62L, are formed on a first surface MS61 of the insulator film 60. Next, the insulator film 60 is attached to a support film 70. The insulator film 60 has a second surface MS62 on which an adhesive layer is formed. Each of the insulator film 60 and the support film 70 is a long object for holding a large number of the RFID tags in an array.

Subsequently, the RFIC module 102 is mounted on the first surface MS61 of the insulator film 60 with an adhesive layer 5 bonded between the RFIC module 102 and the first surface MS61 of the insulator film 60. In this state, an antenna-side first terminal electrode 11 and the conductor pattern 61P oppose each other with the base material 1 and the adhesive layer 5 therebetween; and an antenna-side second terminal electrode 12 and the conductor pattern 62P oppose each other with the base material 1 and the adhesive layer 5 therebetween.

Subsequently, as illustrated in FIG. 10B, the first surface MS61 of the insulator film 60 is covered with a label sheet 8 such that an upper part of the RFIC module 102 is covered. The label sheet 8 has, on its inner surface, an adhesive layer. The label sheet 8 covers the insulator film 60 and the upper part of the RFIC module 101, and is attached to them via the adhesive layer.

The long objects described above are wound into a roll and conveyed from a supplying side roll to a winding side roll, and due to the conveyance, the process steps above are consecutively executed.

Subsequently, in a state where a large number of the RFID tags, each illustrated in FIG. 10B, are wound into a roll, the roll is heated to be tightly wounded. As a result, the protective film 3 is melted and corners of the protective film 3 are rounded. Further, in accordance with an amount of the protective film 3 and a height from the insulator film 60 to the protective film 3, the protective film 3 melts to spread out to an upper surface of the insulator film 60 as illustrated in FIG. 10C. Thereby, the label sheet 8 covering the upper part of the RFIC module 102 is gently shaped.

In the second embodiment too, after the label sheet 8 has been attached, instead of being heated in the rolled state, the RFID tag in a state illustrated in FIG. 10B may pass between heat press rollers while conveyed from the supplying side roll to the winding side roll. As a result, the protective film 3 may be heated and pressurized.

In general, it is noted that the foregoing embodiments are to be considered in all respects as merely illustrative and not restrictive. Changes and modifications may be made by those skilled in the art.

The invention claimed is:

1. A communication device comprising:
   an RFIC module that includes:
   a base material;
   an RFIC mounted on the base material;
   an antenna-side terminal electrode disposed on the base material and configured to be coupled to an antenna; and an insulating protective film formed of a hot melt resin and that covers a first surface of the base material and that entirely and directly covers the RFIC except where the RFIC is mounted on the base material, with the insulating protective film being a single layer that is disposed directly on the RFIC.

2. The communication device according to claim 1, wherein the hot melt resin has a softening point of at least 60° C., the softening point being defined in an R & B method.

3. The communication device according to claim 1, further comprising a flexible insulator film, an antenna pattern of the antenna being disposed thereon.

4. The communication device according to claim 3, wherein the RFIC module is mounted on a first surface of the flexible insulator film.

5. The communication device according to claim 4, further comprising a label sheet configured to cover the first surface of the flexible insulator film on which the RFIC module is mounted.

6. The communication device according to claim 5, wherein the insulating protective film spreads out between the flexible insulator film and the label sheet by softening of the insulating protective film, such that an upper portion of the RFIC module that faces the label sheet has a rounded shape.

7. The communication device according to claim 3, wherein the antenna-side terminal electrode is capacitively coupled to the antenna pattern.

8. The communication device according to claim 3, wherein the antenna pattern comprises a pair of conductor patterns disposed on opposing sides of the RFIC module.

9. The communication device according to claim 8, wherein each of the pair of conductor patterns comprises a meander line shape portion constructed as an inductance component and a planar shape portion coupled thereto and configured as a capacitance component.

10. A method for manufacturing a communication device, the method comprising:
    preparing a plurality of RFIC modules by:
        mounting a plurality of RFICs on a first surface of a base material on which a first conductor pattern is formed for coupling to an antenna pattern and a second conductor pattern is formed for connecting to an RFIC;
        forming an insulating protective film of a hot melt resin on the first surface of the base material and that entirely and directly covers the plurality of RFICs except where the RFICs are mounted on the base material, with the insulating protective film being a single layer that is disposed directly on the RFICs;
    heat-pressing the base material and the insulating protective film to flatten the insulating protective film; and
    separating the base material, a respective RFIC of the plurality of RFICs, and the insulating protective film to form an RFIC module.

11. The method for manufacturing the communication device according to claim 10, further comprising mounting the RFIC module on a first surface of a flexible insulator film on which the antenna pattern is formed, to couple the first conductor pattern to the antenna pattern.

12. The method for manufacturing the communication device according to claim 11, further comprising covering the first surface of the flexible insulator film with a label sheet or a release paper sheet to form a laminated body.

13. The method for manufacturing the communication device according to claim 12, further comprising pressurizing and heating the laminated body to soften the insulating protective film.

14. The method for manufacturing the communication device according to claim 13, wherein the softening of the insulating protective film spreads out the insulating protective film between the flexible insulator film and the label sheet or the release paper, such that an upper portion of the RFIC module that faces the label sheet or the release paper has a rounded shape.

15. The method for manufacturing the communication device according to claim 11, further comprising forming the antenna pattern on the first surface of the flexible insulator film to include a pair of conductor patterns disposed on opposing sides of the RFIC module.

16. The method for manufacturing the communication device according to claim 15, further comprising forming the pair of conductor patterns to each include a meander line shape portion constructed as an inductance component and a planar shape portion coupled thereto and configured as a capacitance component.

17. The method for manufacturing the communication device according to claim 10, wherein the hot melt resin has a softening point of at least 60° C., the softening point being defined in an R & B method.

* * * * *